United States Patent
Mitsuishi

(10) Patent No.: US 7,332,930 B2
(45) Date of Patent: Feb. 19, 2008

(54) NOISE CANCELLER CIRCUIT

(75) Inventor: Masafumi Mitsuishi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 272 days.

(21) Appl. No.: 11/115,326

(22) Filed: Apr. 27, 2005

(65) Prior Publication Data

US 2005/0242841 A1  Nov. 3, 2005

(30) Foreign Application Priority Data

Apr. 28, 2004  (JP) .............................. 2004-133614

(51) Int. Cl.
*H03K 17/16* (2006.01)
*H04B 1/10* (2006.01)

(52) U.S. Cl. ............................ 326/21; 326/22; 326/26; 375/254

(58) Field of Classification Search ............ 326/26–28; 375/254

See application file for complete search history.

(56) References Cited

U.S. PATENT DOCUMENTS 5,990,948 A * 11/1999 Sugiki ........................ 348/250
6,023,770 A * 2/2000 Miyake ....................... 713/401
6,573,756 B2 * 6/2003 Mathew et al. ............... 326/96

FOREIGN PATENT DOCUMENTS

JP  3-290721  12/1991
JP  11-27119  1/1999

* cited by examiner

*Primary Examiner*—Vibol Tan
(74) *Attorney, Agent, or Firm*—McGinn IP Law Group, PLLC

(57) ABSTRACT

A noise canceller circuit capable of suppressing power supply noise, produced by transition of a data signal, even in case a data signal is increased in speed. The noise canceller circuit includes an output buffer 20 for outputting a first binary signal that may undergo transition at a timing synchronized with clock signals, and a second output buffer 21 for outputting a second binary signal which has undergone transition in case the first binary signal does not undergo transition at the above timing and for outputting the second binary signal without transition in case the first binary signal has undergone transition at the above timing. The respective output circuits of the output buffers 20, 21 are the same and are constructed so that the respective power supply sources VDD and the ground GND are common to the buffer circuits. A capacitor 24 for absorbing the noise is provided across the power supply and the ground.

16 Claims, 7 Drawing Sheets

$30_0 \sim 30_{m-1}$ : 1ST UNIT OUTPUT CIRCUIT
$40_0 \sim 40_{m-1}$ : 2ND UNIT OUTPUT CIRCUIT
30A, 40A : 1ST AND 2ND INPUT MEANS
30B, 40B : 1ST AND 2ND OUTPUT MEANS
$50_0 \sim 50_{n-1}$ : OUTPUT TERMINAL
CS, $\overline{CS}$ : CONTROL SIGNAL
$I_0 \sim I_{n-1}$ : INPUT SIGNAL
$Q_0 \sim Q_{n-1}$ : OUTPUT SIGNAL

NOISE CANCELLER CIRCUIT

FIELD OF THE INVENTION

This invention relates to a noise canceller circuit and, more particularly, to a noise canceller circuit for reducing the power supply noise.

BACKGROUND OF THE INVENTION

In keeping up with the rapid progress in the IT (Information Technology), the data transmitting rate on e.g. a transmission channel is increasing incessantly. One of the indices for the quality for high rate data transmission is jitter. Among the factors responsible for degrading jitter characteristics, there is power supply noise in an input/output circuit and in an internal circuit. In a known manner, the power supply noise is increased by simultaneous operation of the plural input/output circuits and the internal circuit. Thus, various attempts were made for shifting the data transition timing with, e.g. a delay circuit.

For example, there is known an output circuit disclosed in Patent Document 1. This output circuit and a timing diagram therefore are shown in FIGS. 6 and 7, respectively. If plural simple output buffers are arrayed, and data signals I0 to In-1, entered to an output circuit, are of the same pattern and are of coincident transition point timings, data transition points of output signals Q0 to Qn-1 are also coincident, with a result that the transient current is increased and hence the power supply potential VCC as well as the ground potential is subjected to significant transient variations. In order to tackle with this inconvenience, even-numbered output buffers and odd-numbered output buffers in the embodiment of FIG. 6 are of different circuit configurations from each other so that the transition timings of the even-numbered and the odd-numbered output buffers are not coincident with each other. Specifically, as may be seen from the timings shown in FIG. 7, the even-numbered circuits are constructed for elongating the delay timing of the falling edge of the input signal, whereas the odd-numbered circuits are constructed for elongating the delay timing of the rising edge of the input signal. This offsets the timings of both the rising edges and falling edges of the even- and odd-numbered output signals, respectively, such as to distribute transient variations of the power supply voltage VCC and the ground potential VSS to suppress variations.

In the above Patent Document 1, the transition timings of the even-numbered output buffers are aligned to one another, whilst the transition timings of the output buffers of the odd-numbered are also aligned to one another. Hence, if desired to further suppress the variations (noise) of the power supply, it becomes necessary to control the output buffers independently of one another. The technique for implementing this has been shown in Patent Document 2. In the circuit shown in this Patent Document 2, the data signal and the control signal of one of two neighboring output buffers are entered as a control signal to the other output buffer to shift data transition timings of the totality of the output buffers automatically.

[Patent Document 1]
    JP Patent Kokai Publication No. JP-A-3-290721 (FIGS. 1 and 3)
[Patent Document 2]
    JP Patent Kokai Publication No. JP-A-11-27119 (FIG. 2)

SUMMARY OF THE DISCLOSURE

In the case of handling low-speed data signals, offsetting the timing of transition points (edges) of data signals, as in the related art examples, is not of a problem. However, with increasing data speed, the timing margin for one period of data signals becomes severer, so that it becomes difficult to reduce the noise by offsetting the signal edges.

Usually, transient potential variations (transient power supply noise), produced by transition points of data signals, converge by, e.g. a decoupling capacitor, connected across power supply sources, such that oscillations subside before the oncoming of the next data transition point. However, with increase in the speed of the data signals, it may be an occurrence that, before subsidence of transient power supply noise produced by a certain data transition point, the next data transition point may arrive to produce a new power supply noise. In this case, the customary technique of suppressing the power supply noise by slightly shifting the data transition point does not work satisfactorily. Rather, it may become necessary to scrutinize which of the frequency components contained in a data pattern is responsible for causing the power supply variations in case the impedance across the power supply units the output buffers are connected to and also the data pattern are taken into consideration.

FIG. 4 shows the results of impedance analysis across the ground and the power supply the output buffer is connected to. FIG. 4 shows the results of simulation in case the value of the decoupling capacitor, inserted across the power supply and the ground in a SerDes (Serializer/Deserializer) macro, has been changed in four values (X1, X2, X4, X8). It is noted that the SerDes macro is a high-speed interface macro frequently used in a high-speed data transmitting/receiving circuit. The impedance value is increased by a range from tens of MHz to hundreds of MHz, corresponding to a series resonance point of the decoupling capacitor and the parasitic inductance of, e.g. a bonding wire. On the high frequency side towards the right of the resonance point, there is raised no problem because the transient current is suppressed by the decoupling capacitor in the SerDes macro. On the side towards the left of the resonance point, with the frequency not larger than about 10 MHz, the transient current may be suppressed by a decoupling capacitor mounted on the board. Thus, it is seen that the power supply noise in the vicinity of several tens of MHz to several hundreds of MHz is of a problem.

FIG. 5 shows the results of simulation in case a pseudo random pattern is passed through an output buffer circuit of this power supply impedance. The transient current is produced for data transition points, as shown in FIG. 5. The potential noise across the VDD and the GND undergoes oscillations at a period of approximately 5 ns (approximately 100 MHz). In such case, only slight shifting of data edges of neighboring buffers, as in the customary circuit, scarcely gives any noticeable effect of amelioration.

It is therefore an object of the present invention to provide a noise canceller circuit whereby power supply noise ascribable to transition points of data signals may be suppressed even if the data signal speed is increased.

According to an aspect of the present invention there is provided a noise canceller circuit comprising a first circuit for outputting a first binary signal that may undergo transition at a timing synchronized with a clock signal, and a second circuit for causing a second binary signal to undergo transition in case the first binary signal does not undergo transition at the above timing, and for outputting a second binary signal which has undergone transition. The second circuit outputs the second binary signal without undergoing transition in case the first binary signal does undergo transition at the above timing.

The output circuits of the first and second circuits are preferably of the same configuration and have a power supply and the ground in common.

The noise canceller circuit may further comprise a noise-absorbing capacitor for a power supply of the first circuit and for a power supply of the second circuit.

The same load is preferably connected to the output circuits of the first and second circuits.

The output circuit of the first circuit preferably outputs a balanced output signal.

The noise canceller circuit preferably further comprises a cancel data generating circuit for generating an input signal of the second circuit from an input signal of the first circuit and from the clock signals.

The cancel data generating circuit preferably comprises: a first flipflop circuit for latching an input signal of the first circuit with an edge of the clock signal; a second flipflop circuit for latching an output signal of the cancel data generating circuit with the edge; a first Ex-OR circuit supplied with an input signal of the first circuit and with an output signal of the first flipflop circuit; and a second Ex-OR circuit supplied with a logical inverted signal of an output of the first Ex-OR circuit and with an output signal of the second flipflop circuit, for delivering an output signal of the cancel data generating circuit. A data transmitting/receiving apparatus comprises a plurality of the noise canceller circuits as mentioned hereinabove.

The meritorious effects of the present invention are summarized as follows.

According to the noise canceller circuit of the present invention, in which the noise of the low frequency component, otherwise caused by the transient current of the power supply, dependent on a data pattern, may be canceled, and the power supply noise, dependent on the data pattern, generated within the circuit, may be suppressed, such as to decrease the jitter in a macro for high-speed transmission.

PREFERRED EMBODIMENTS OF THE INVENTION

Figure 1:
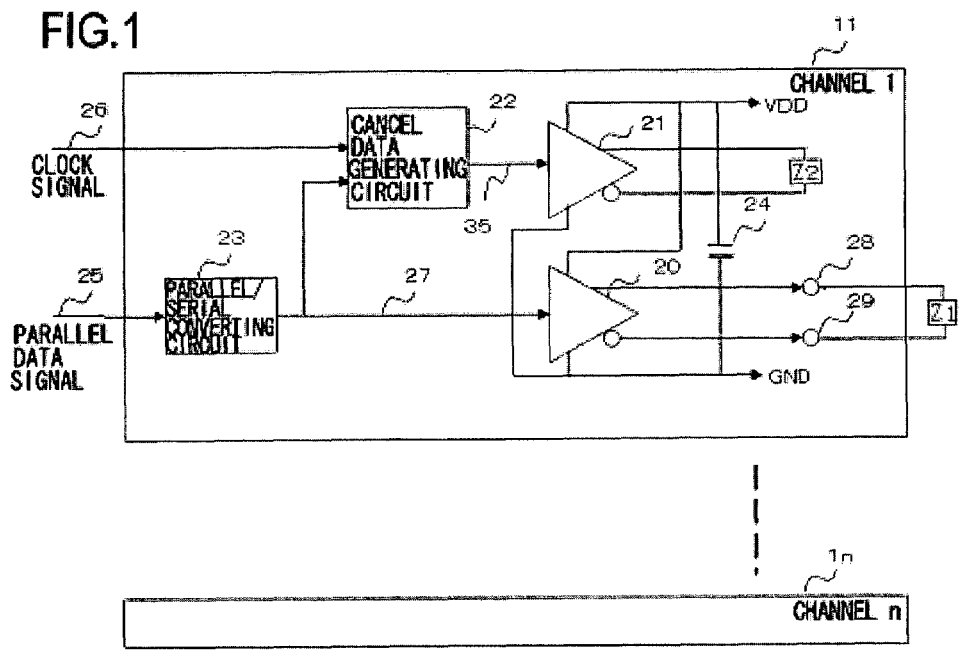
FIG. 1 is a block diagram of a noise canceller circuit according to an embodiment of the present invention.

The noise canceller circuit, embodying the present invention, comprises a first circuit (20 of FIG. 1) and a second circuit (21). The first circuit (20 of FIG. 1) outputs a first binary signal that may undergo transition at a timing synchronized with a clock signal (26 of FIG. 1). The second circuit (21 of FIG. 1) causes a second binary signal to undergo transition in case the first binary signal does not undergo transition at the above timing, and the second circuit further outputs the second binary signal without undergoing transition in case the first binary signal does not undergo transition at the above timing. The output circuits of the first circuit (20 of FIG. 1) and the second circuit (21 of FIG. 1) are preferably of the same configuration and have a power supply and the ground in common. The noise canceller circuit may further comprise a capacitor (24 of FIG. 1) for absorbing the noise of the power supply across the power supply and the ground. The same load may be connected to the output circuits of the first and second circuits. The output circuit of the first circuit may output a balanced output signal. The noise canceller circuit may further comprise a cancel data generating circuit (22 of FIG. 1) for generating an input signal of the second circuit from an input signal of the first circuit and from the clock signal.

With the above-described noise canceller circuit, the power supply noise, flowing in the power supply by the first and second circuits, is solely the period component synchronized with the clock signal, and those components having frequencies less than the frequency of the clock signal cycle are canceled to suppress the power supply noise. Meanwhile, the high frequency components not less than a frequency of the clock signal cycle are removed by providing, across the power supply and the ground, a decoupling capacitor which will absorb the noise in a chip.

First Embodiment

The noise canceller circuit will now be explained in more detail. FIG. 1 depicts a block diagram of a noise canceller circuit embodying the present invention. In FIG. 1, there are provided noise canceller circuits 11, . . . , 1n, for n channels, which are similar to one another to make up a data transmitting/receiving apparatus. In the following, the noise canceller circuit 1 for a channel 1 will be explained.

The noise canceller circuit 11 includes output buffers 20, 21, a cancel data generating circuit 22 and a parallel/serial converting circuit 23. A parallel data signal 25, synchronized with a clock signal 26, is converted by the parallel/serial converting circuit 23 into serial data which then appears on a node (or line) 27. This serial data is buffered by the output buffer 20 and output as a balanced signal from output terminals 28, 29. The serial data on the node 27 is entered, along with the clock signal 26, to the cancel data generating circuit 22. The cancel data generating circuit 22 causes a serial data on a node 35 to undergo transition to output a data, which has undergone the transition, in case the serial data on the node 27 does not undergo transition with a timing synchronized with the clock signal 26. On the other hand, the cancel data generating circuit outputs the serial data on the node 35, without transition, in case the serial data on the node 27 undergoes transition. The serial data on the node 35 is buffered by the output buffer 21.

The noise canceller circuit, shown in FIG. 1, is an example of a circuit structure for suppressing the power supply noise which depends on a data pattern of the output buffer. In an ordinary SerDes macro, the output buffer 20 is supplied with an output of the parallel/serial converting circuit 23. That is, an output of the parallel/serial converting circuit 23 is coupled to the node 27 of the output buffer 20 as a subject (objective) of reduction of the power supply noise. In the vicinity of the output buffer 20, there is arranged an output buffer 21 which is a duplicate (a replica circuit) of the output buffer 20. That is, there is arranged the output buffer 21 which is of the same configuration as the output buffer 20. It is noted however that the output buffer 21 does not have to be of completely identical structure with the output buffer 20 provided that output buffer 21 is the same as the output buffer 20 as to the function, i.e. as to the current flowing through the power supply as a result of variations in the input signal.

The signal on the node 27 is rendered a signal on the node 35, via the cancel data generating circuit 22. This signal on the node 35 is supplied to the output buffer 21. A power supply terminal and a ground terminal of the output buffers 20, 21 are coupled common to a capacitor 24 and respectively connected to a power supply VDD and to a ground GND. A load Z2 equivalent to the load Z1 on the output buffer 20 may be connected to the output the output buffer 21. In addition, although an output of the output buffer 20 is of the balanced type, it may also be of an unbalanced type.

Figure 2:
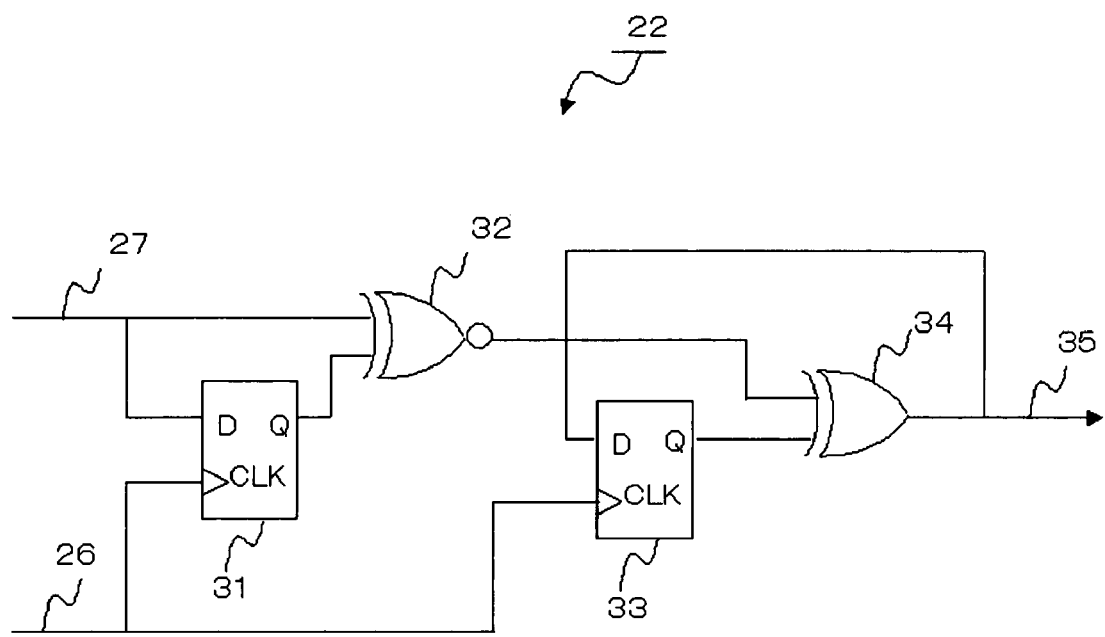
FIG. 2 is a circuit diagram of a cancel data generating circuit of the embodiment of the present invention.

FIG. 2 depicts a specified circuit diagram of a cancel data generating circuit (SSO (Simultaneous Switching Output) canceller circuit) shown in FIG. 1. The cancel data generating circuit includes D-flipflop circuits 31, 33, a coincidence circuit 32 and an Ex-OR circuit 34. The D-flipflop circuit 31 latches an input signal on the node 27 with a rise edge of the clock signal 26. The D-flipflop circuit 33 latches an output signal on the node 35 of the cancel data generating circuit 22 with a rise edge of the clock signal 26. The coincidence circuit 32 is supplied with an input signal of the node 27 and an output signal of the D-flipflop circuit 31. The Ex-OR circuit 34 is supplied with an output signal of the coincidence circuit 32 and with an output signal of the D-flipflop circuit 33 to deliver an output signal of the cancel data generating circuit 22 to the node 35.

The cancel data generating circuit 22 does not have to be formed as shown in FIG. 2. It is only sufficient to construct the cancel data generating circuit 22 so that the cancel data generating circuit causes the serial data on the node 35 to undergo transition to output the data which has undergone the transition, in case the serial data on the node 27 does not undergo transition with a timing synchronized with the clock signal 26, and so that the cancel data generating circuit 22 outputs the serial data on the node 35 without undergoing transition in case the serial data on the node 27 has undergone transition.

The operation of the noise canceller circuit of the present embodiment will now be explained. When a data (with data pattern) shown in FIG. 3 (at first line) is supplied to the node 27 of the output buffer 20, the transient current (dynamic current) flows through the output buffer 20 (at second line). This causes variations in the potential difference across the VDD and the GND. The more random the data pattern, the broader is the range of the frequency components contained in the waveform of the potential difference.

Figure 3:
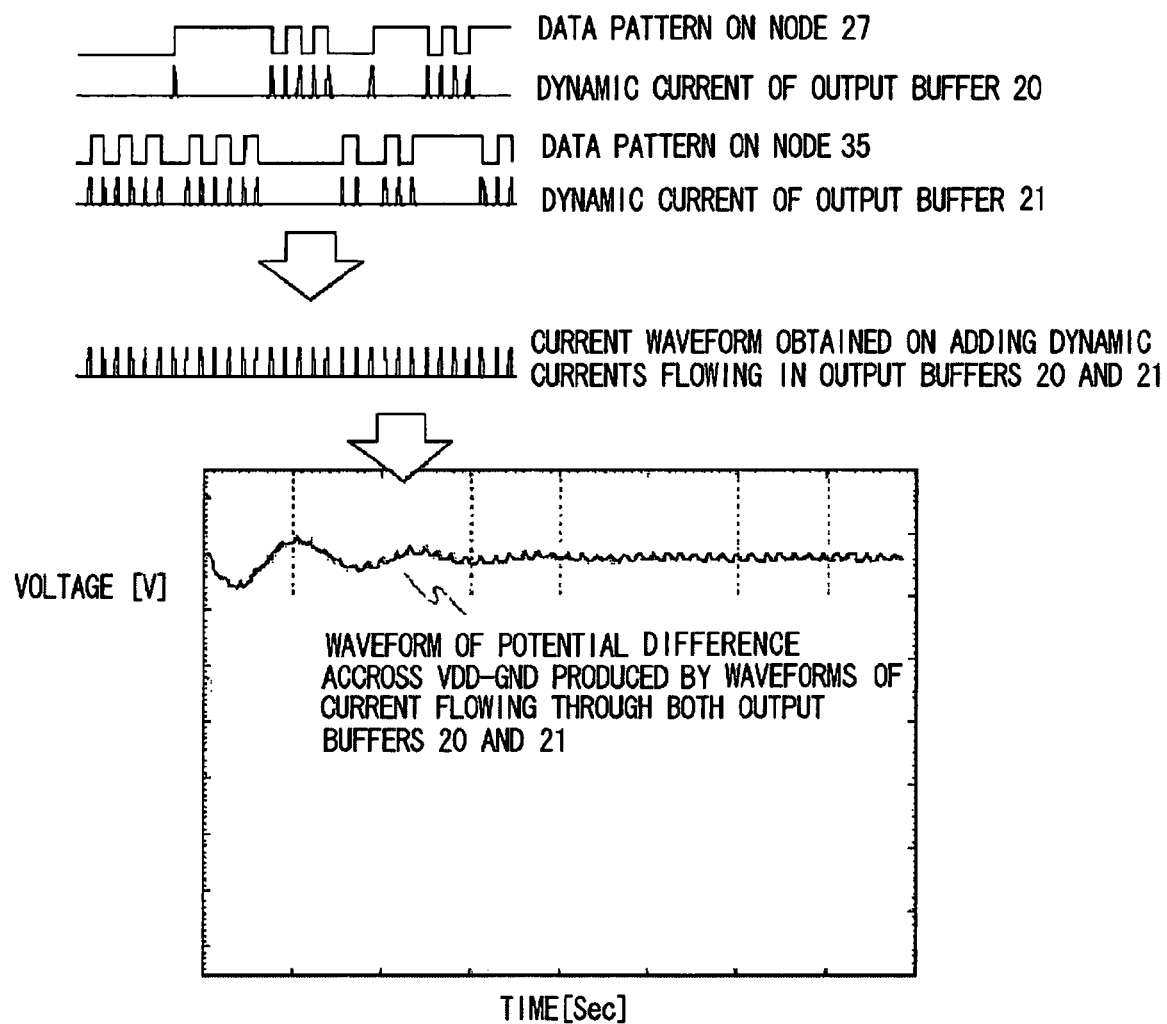
FIG. 3 shows waveforms of various parts in case of employing the noise canceller circuit of the embodiment of the present invention.
Figure 4:
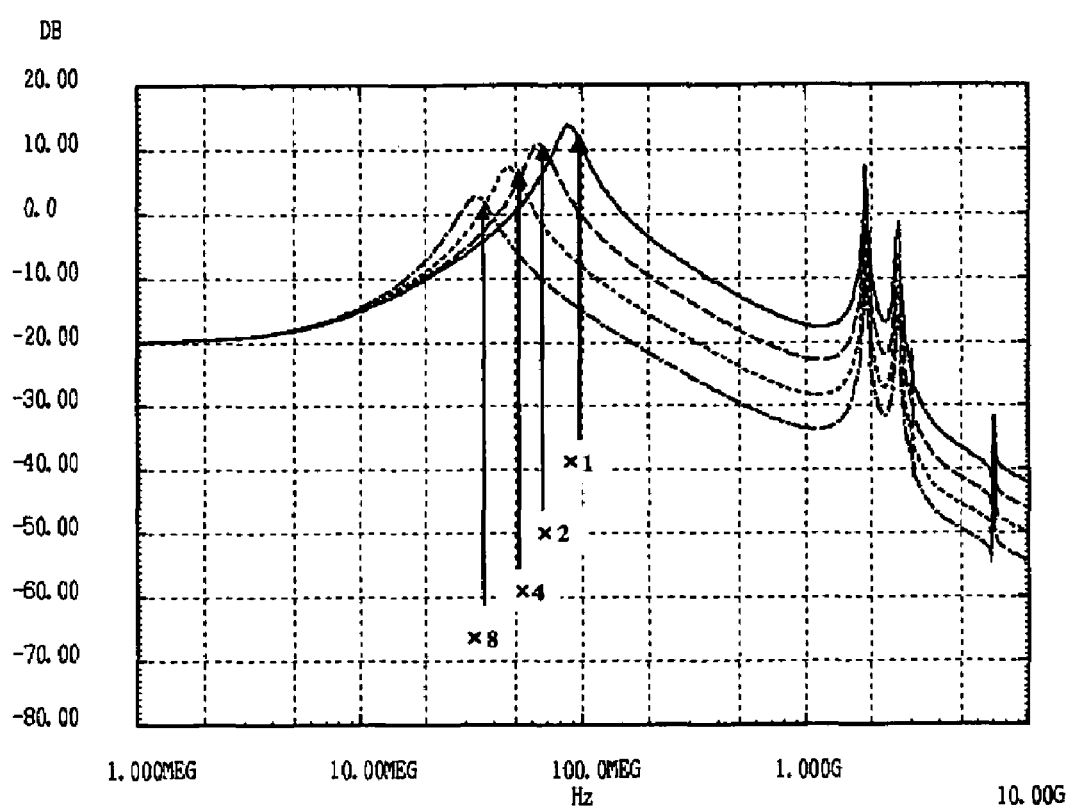
FIG. 4 shows the results of analysis of the impedance of an electrical path across the power supply and the ground GND to which is connected an output buffer.
Figure 5:
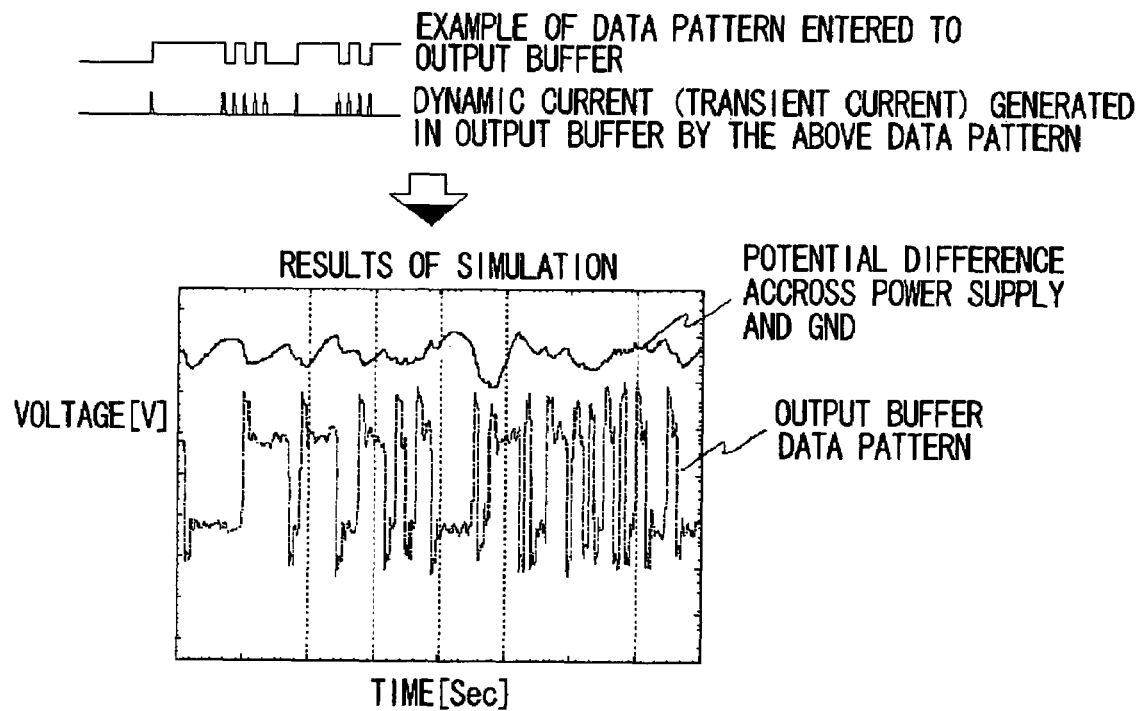
FIG. 5 shows the results of simulation in case a pseudo random pattern is passed through the output buffer circuit.
Figure 6:
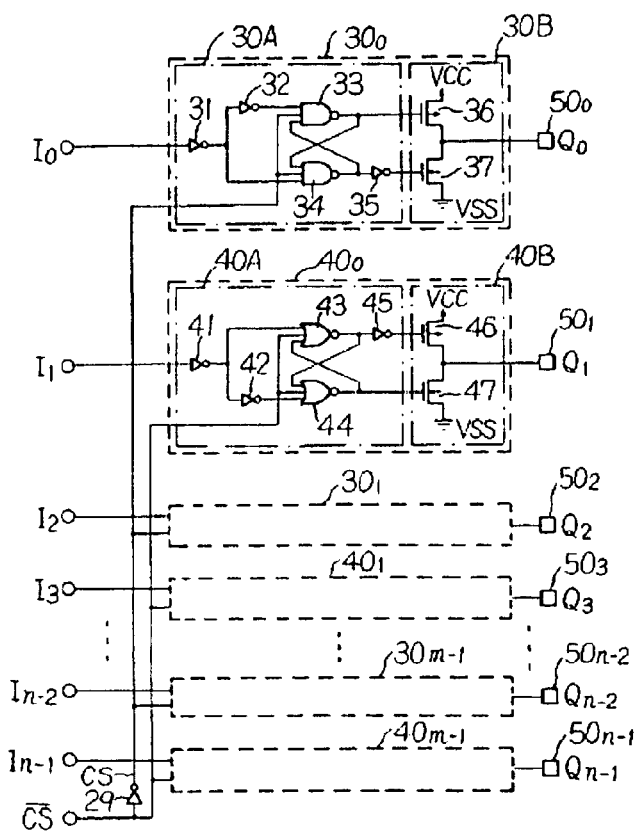
FIG. 6 is a circuit diagram showing an example of a conventional output circuit.
Figure 7:
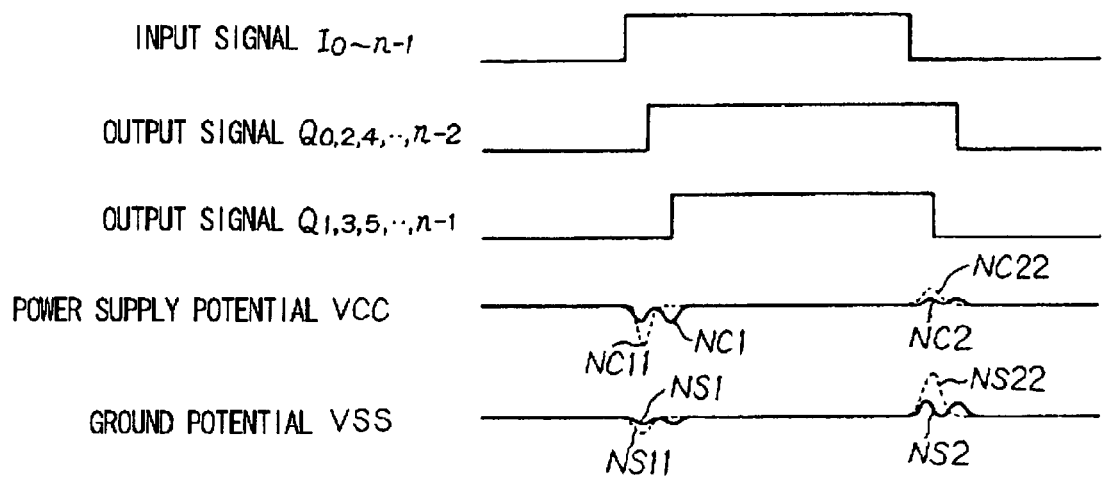
FIG. 7 is a timing chart for the conventional output circuit.

By applying to the node 35 such a data pattern in which, for the data pattern on the node 27 and the associated dynamic current, data undergoes transition and does not undergo transition where there are no data transition points and where there are data transition points, respectively, and by driving the output buffer 21, provided as a replica circuit, with this data pattern, the current waveform and the data pattern on the node 35, shown in FIG. 3, are generated (at third and fourth lines).

The waveform of the dynamic current, resulting from the waveforms on the nodes 27 and 35, flowing through the common power supply of the output buffers 20, 21, is the sum of the two current waveforms, and is a discrete current waveform having a fixed space corresponding to the period of the frequency f of the clock signals. As a principle, the current waveform includes no frequency components less than f (at fifth line in FIG. 3).

Thus, if the impedance of the power supply has a resonance point in a frequency range of from several tens of MHz to several hundreds of MHz, it is possible not to have frequency components corresponding to the resonance point such as to prevent the power supply noise from increasing. In the case of FIG. 3, high frequency components equal to or higher than the frequency f are increased, however, these frequency components can be suppressed by a decoupling device provided in the circuit (macro). The results confirmed by simulation are shown in FIG. 3, from which it may be seen that the power supply noise across VDD and GND, which is significant at a transient portion corresponding to the start point of the simulation, is then suppressed sufficiently.

In the conventional case, the timing of the transition point of data is shifted by adding delay circuits on a data bus. This technique is difficult to use in practice and raises a problem that duty distortion is produced in the data during high speed operation, thus decreasing the timing margin.

According to the present invention, shown in FIG. 1, no devices are inserted in the line of the parallel/serial converting circuit 23 or to the output buffer 20, that is, into the intrinsic data bus. Instead, the output buffer 21 is provided and the waveform for canceling the noise is generated from data, branched to the cancel data generating circuit 22. Consequently, there is no risk of affecting the timing of data transition points thus avoiding the problem inherent in the conventional art circuit.

As typical of a driver, generating the dynamic current, there is a push-pull type device modified from a CMOS. This driver, having low power consumption and a high driving ability for a device size, suffers from a large operating noise. With the application of the present invention, the concurrent operating noise may be diminished to enlarge the range of application significantly.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A noise canceller circuit comprising:
   a first circuit for outputting a first binary signal that may undergo transition at a timing synchronized with a clock signal; and
   a second circuit for causing a second binary signal to undergo transition in case said first binary signal does not undergo transition at said timing, and for outputting a second binary signal which has undergone transition, said second circuit outputting said second binary signal without transition in case said first binary signal does undergo transition at said timing.

2. The noise canceller circuit as defined in claim 1 wherein output circuits of said first and second circuits are of a same configuration and have a power supply and a ground in common.

3. The noise canceller circuit as defined in claim 1 further comprising:
   a noise-absorbing capacitor for a power supply of said first circuit and said second circuit.

4. The noise canceller circuit as defined in claim 1, wherein
   a same load is connected to each of the output circuits of said first and second circuits.

5. The noise canceller circuit as defined in claim 1 wherein
the output circuit of said first circuit outputs a balanced output signal.

6. A data transmitting/receiving apparatus comprising a plurality of the noise canceller circuits as defined in claim 1.

7. A noise canceller circuit comprising:
a first circuit for outputting a first binary signal that may undergo transition at a timing synchronized with a clock signal;
a second circuit for causing a second binary signal to undergo transition in case said first binary signal does not undergo transition at said timing, and for outputting a second binary signal which has undergone transition, said second circuit outputting said second binary signal without transition in case said first binary signal does undergo transition at said timing; and
a cancel data generating circuit for generating an input signal of said second circuit from an input signal of said first circuit and from said clock signals.

8. The noise canceller circuit as defined in claim 7, wherein said cancel data generating circuit comprises:
a first flipflop circuit for latching an input signal of said first circuit with an edge of said clock signal;
a second flipflop circuit for latching an output signal of said cancel data generating circuit with said edge;
a first Ex-OR circuit supplied with an input signal of said first circuit and with an output signal of said first flipflop circuit; and
a second Ex-OR circuit supplied with a logical inverted signal of an output of said first Ex-OR circuit and with an output signal of said second flipflop circuit, for delivering an output signal of the cancel data generating circuit.

9. The noise canceller circuit as defined in claim 7 further comprising:
a noise-absorbing capacitor for a power supply of said first circuit and said second circuit.

10. The noise canceller circuit as defined in claim 7 wherein output circuits of said first and second circuits are of a same configuration and have a power supply and a ground in common.

11. The noise canceller circuit as defined in claim 7, wherein
a same load is connected to each of the output circuits of said first and second circuits.

12. The noise canceller circuit as defined in claim 7 wherein
the output circuit of said first circuit outputs a balanced output signal.

13. A data transmitting/receiving apparatus comprising a plurality of the noise canceller circuits as defined in claim 7.

14. A data transmitting/receiving apparatus comprising a plurality of the noise canceller circuits as defined in claim 8.

15. A data transmitting/receiving apparatus comprising a plurality of the noise canceller circuits as defined in claim 9.

16. A data transmitting/receiving apparatus comprising a plurality of the noise canceller circuits as defined in claim 12.

* * * * *